United States Patent
Maeda

(10) Patent No.: US 7,339,420 B2
(45) Date of Patent: Mar. 4, 2008

(54) METHOD OF SWITCHING PLL CHARACTERISTICS AND PLL CIRCUIT

(75) Inventor: Masakatsu Maeda, Mukou (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 99 days.

(21) Appl. No.: 11/189,115

(22) Filed: Jul. 26, 2005

(65) Prior Publication Data

US 2006/0022726 A1 Feb. 2, 2006

(30) Foreign Application Priority Data

Jul. 27, 2004 (JP) .............................. 2004-218176

(51) Int. Cl.
*H03B 1/00* (2006.01)
*H03K 5/00* (2006.01)
*H04B 1/10* (2006.01)

(52) U.S. Cl. .................. 327/554; 327/552; 327/553; 331/36 C

(58) Field of Classification Search ................ 327/156, 327/552, 553, 558; 331/36 C, 36 R
See application file for complete search history.

(56) References Cited

U.S. PATENT DOCUMENTS

| | | | | |
|---|---|---|---|---|
| 4,783,635 A | * | 11/1988 | Sevastopoulos | ............. 330/107 |
| 5,570,398 A | * | 10/1996 | Smith | ........................... 375/376 |
| 6,583,675 B2 | * | 6/2003 | Gomez | ........................... 331/17 |
| 6,727,763 B2 | * | 4/2004 | Endo | .............................. 331/17 |
| 2004/0021507 A1 | * | 2/2004 | Fischer | ........................ 327/558 |
| 2005/0024132 A1 | * | 2/2005 | Laletin | ......................... 327/558 |

OTHER PUBLICATIONS

J. Briaire, et al.; "Substrate Injection and Crosstalk in CMOS Circuits," IEEE Custom Integrated Circuits Conference 1999, pp. 483-486.

* cited by examiner

*Primary Examiner*—Quan Tra
*Assistant Examiner*—Colleen O'Toole
(74) *Attorney, Agent, or Firm*—Stevens, Davis, Miller & Mosher, LLP.

(57) ABSTRACT

A loop filter which is a component of a PLL circuit includes a switching element for switching a capacitance value which connects and disconnects a second capacitive element to a first capacitive element according to a natural angular frequency switching signal, and a switching element for switching a resistance value which short-circuits and opens between both ends of a resistance element according to a natural angular frequency switching signal in order to keep a damping factor at a constant value. It further includes an operational amplifier for charging the second capacitive element at the same potential as the first capacitive element when the second capacitive element is isolated from the first capacitive element.

12 Claims, 15 Drawing Sheets

METHOD OF SWITCHING PLL CHARACTERISTICS AND PLL CIRCUIT

BACKGROUND OF THE INVENTION

1. Field of the Invention

The present invention relates mainly to a method of switching a PLL characteristic allowing to achieve a reduction in operational noise in a PLL circuit, and a PLL circuit.

2. Description of Related Art

FIG. 12 is a block diagram showing a configuration of a conventional art of a PLL circuit. FIG. 13 is a circuit diagram showing a configuration of a low pass filter, namely a loop filter, which is one of the components of the PLL circuit in FIG. 12. FIG. 14 is a timing chart showing operation of the PLL circuit in FIG. 12.

According to this PLL circuit, as shown in FIG. 12, a phase difference between a divided signal 6 obtained by dividing an output signal 9 of a voltage controlled oscillator 1 into 1/M by a variable divider 2 and a reference signal 7 outputted from a temperature compensated crystal oscillator 11 is detected by a phase comparator 3. A voltage pulse with a pulse width according to the phase difference between the divided signal 6 and the reference signal 7, the phase difference having been detected by the phase comparator 3 is sent to charge pumps 4 and 10 from the phase comparator 3. The charge pumps 4 and 10 output a voltage or a current according to an output of the phase comparator 3. The charge pump 4 is directly connected to a loop filter 5. Meanwhile, the charge pump 10 is connected to the loop filter 5 via a switching element (SW1) 14 which is switched on or off according to a natural angular frequency switching signal 16. Accordingly, when the natural angular frequency switching signal 16 is in a first state, only the output of the charge pump 4 is supplied to the loop filter 5. Meanwhile, when the natural angular frequency switching signal 16 is in a second state, both of the outputs of the charge pumps 4 and 10 are supplied to the loop filter 5. The outputs of these charge pumps 4 and 10 are smoothed by the loop filter 5, and transmitted to the voltage controlled oscillator 1 as a control voltage 13. In this case, a natural angular frequency $\omega n$ of the PLL circuit has different values according to the cases of supplying only the output of the charge pump 4 to the loop filter 5, and of supplying both outputs of the charge pumps 4 and 10 to the loop filter 5. In the later case, the natural angular frequency $\omega n$ becomes higher as compared with that in the former case.

The natural angular frequency switching signal 16 is inputted also into the loop filter 5, so that values of resistances composing the loop filter 5 are switched depending on a state of the natural angular frequency switching signal 16. It is intended that even when the natural angular frequency $\omega n$ is switched according to supplying or not supplying the output of the charge pumps 10 to the loop filter 5 as described above, a damping factor $\zeta$ of the PLL circuit may not be changed.

As shown in FIG. 13, the loop filter 5 includes a capacitive element Cp connected between an output terminal of the charge pump 4 and a ground, a series circuit of resistance elements Rz1 and Rz2 and a capacitive element Cz connected between the output terminal of the charge pump 4 and the ground, a switching element (SW2) 17 connected in parallel to the resistance element Rz2. The switching element (SW2) 17 is switched on or off depending on the state of the natural angular frequency switching signal 16. The output terminal of the charge pump 4 is connected to a control voltage terminal of the voltage controlled oscillator 1 as it is.

According to such a manner as described above, the output signal 9 of the voltage controlled oscillator 1 is divided into 1/M by the variable divider 2, and fed back to the phase comparator 3 as the divided signal 6. Accordingly, supposing that a frequency division ratio of the variable divider 2 is M, and a frequency of the reference signal 7 is fref, a frequency fo of the output signal 9 of the voltage controlled oscillator 1 is expressed by Equation (1).

$$fo = M \times fref \qquad \text{Equation (1)}$$

Meanwhile, the natural angular frequency $\omega n$ and the damping factor $\zeta$, which are typically given as a measure of a loop characteristic of the PLL circuit, is expressed by Equations (2) and (3).

$$\omega n = (K \times \omega 2)^{1/2} \qquad \text{Equation (2)}$$

$$\zeta = (1/2) \times (K \div \omega 2)^{1/2} \qquad \text{Equation (3)}$$

Where,
$\omega 2 = 1/(Cz \times Rz)$,
$K = (Kvco \times Icp \times Rz)/(2\pi \times M)$,
$10 \times Cp < Cz$, Icp is a sum of the output currents of the charge pumps 4 and 10 when the switching element (SW1) 14 is switched on, or is an output current of the only charge pump 4 when the switching element (SW1) 14 is switched off, Kvco is a gain of the voltage controlled oscillator 1, Rz is a sum of resistance values of the resistance elements Rz1 and Rz2 when the switching element (SW2) 17 is switched off, or a resistance value of only the resistance element Rz1 when the switching element (SW2) 17 is switched on.

Cz is a capacitance value of the capacitive element Cz.

Here, it is broadly known that an optimal damping factor $\zeta$ is approximately 0.7 due to a high-speed response of the PLL circuit.

According to this conventional art, however, in order to achieve both of the high-speed response and the high C/N ratio, the natural angular frequency $\omega n$ is switched when the frequency is pulled in and is in a steady state.

First, during a steady state, the natural angular frequency switching signal 16 stays in "L" level, so that the switching element (SW1) 14 is switched off, and a current supplied to the loop filter 5 is only the output current of the charge pump 4. Accordingly, the natural angular frequency $\omega n$ of the PLL circuit stays in a low state, and the PLL circuit is kept in a locked state.

Subsequently, when switching the frequency division ratio M of the variable divider 2, the natural angular frequency switching signal 16 rises to "H" level for a certain period from its moment. The switching element (SW1) 14 is switched on in response to this natural angular frequency switching signal 16. As a result, the current supplied to the loop filter 5 will be increased to the summed value of the output currents of the charge pumps 4 and 10 from the output current of only the charge pump 4. Thus, the natural angular frequency $\omega n$ is increased and frequency pulling operation is performed at high speed. At this time, the switching element (SW2) 17 is switched on. Thus, both ends of the resistance element Rz2 are short-circuited, and the damping factor $\zeta$ is adjusted to approximately 0.7 the same value as that during a steady state.

For example, when the value of the current Icp is set to four times, and the value of the resistance element Rz is set to one half only during a frequency pulling, the natural angular frequency ωn can be increased by two times, while keeping the damping factor ζ constant according to Equations (2) and (3). As a result, pulling of the frequency and the phase can be completed at high speed.

Subsequently, by setting the natural angular frequency switching signal 16 to "L" state, the switching elements (SW1, SW2) 14 and 17 are switched off, so that the natural angular frequency ωn is reduced to a steady state value, while keeping the value of the damping factor ζ constant, thereby making it possible to achieve the high C/N ratio.

A relationship between a change of the frequency fo of the output signal of the voltage controlled oscillator 1, and a change of the natural angular frequency switching signal 16 is shown in FIG. 14. In FIG. 14, the frequency fo is stable before time t1, and the PLL circuit stays in a locked state. A period from time t1 to time t2 is a frequency pulling period. A period from time t2 to time t3 is a phase pulling period. After time t3, the frequency fo is stable and the PLL circuit enters a locked state.

Non-patent document 1: "Substrate Injection and Crosstalk in CMOS Circuits" Bell Laboratories, Lucent Technologies IEEE1999 CUSTOM INTEGRATED CIRCUITS CONFERENCE According to the configuration of the conventional art, however, as the drawback of switching the natural angular frequency ωn, the current supplied to the loop filter 5 is increased to the summed value of the output currents of the charge pumps 4 and 10 from the output current of only the charge pump 4 when the natural angular frequency switching signal 16 is in "H" level. As a result, an operating current of the PLL circuit is also increased, so that some currents flow into a semiconductor substrate, and interferes with other blocks, such as the transmission circuit and the reception circuit that are integrated with the PLL circuit on the same semiconductor substrate. Thus, various characteristics of the transmission and reception circuits are degraded. In other words, there has been a problem that the operational noise in the PLL circuit has been large.

The interference described above is produced in a following structure, for example.

FIG. 15 is a sectional view showing a vertical structure of two diodes separated by an insulator. In FIG. 15, reference numeral 101 represents a p⁻ type Si substrate; reference numeral 102 and 103, p⁺⁺ type regions formed on the p⁻ type Si substrate 101; reference numerals 104 and 105, n⁺ type regions formed on the p⁺⁺ type regions 102 and 103, respectively; reference numeral 106, an insulator for isolation embedded in the p⁻ type Si substrate 101; reference numeral 107, a parasitic resistance formed between the p⁺⁺ type regions 102 and 103; and reference numeral 108, a parasitic capacitance formed between p⁺⁺ type regions 102 and 103. The interference described above is produced by such elements.

SUMMARY OF THE INVENTION

It is an object of the present invention to provide a PLL circuit allowing to achieve a reduction in operational noise when a natural angular frequency is increased to achieve a high-speed response.

A PLL characteristic switching method of the present invention is a method of switching a response characteristic of the PLL circuit including at least a voltage controlled oscillator, a phase comparator for comparing phases of an output signal of the voltage controlled oscillator and a reference signal, and a loop filter including a capacitance and a resistance to provide a low-pass component of an output signal of the phase comparator to the voltage controlled oscillator as a control voltage, wherein the PLL circuit operates at a predetermined natural angular frequency and a predetermined damping factor. The PLL characteristic switching method described above includes the steps of, in order to switch the natural angular frequency, switching a value of the capacitance according to a switching signal, and in order to keep the damping factor at a constant value, switching a value of the resistance according to the switching signal in conjunction with switching the value of the capacitance.

According to this method, since the natural angular frequency is increased not by switching the current of the charge pump but by switching the capacitance value in the loop filter, the current flowing through the semiconductor substrate in which the PLL circuit is formed is not increased even when increasing the natural angular frequency in order to obtain the high-speed response. Accordingly, when the natural angular frequency is increased to achieve the high-speed response during a frequency pulling, a reduction in operational noise can be achieved.

Moreover, a PLL circuit of the present invention includes at least a voltage controlled oscillator, a phase comparator for comparing phases of an output signal of the voltage controlled oscillator and a reference signal, and a loop filter for providing a low-pass component of an output signal of the phase comparator to the voltage controlled oscillator as a control voltage, wherein the PLL circuit to operates at a predetermined natural angular frequency and a predetermined damping factor. The loop filter includes a series circuit of a capacitance and a resistance connected to an output terminal of the phase comparator, capacitance switching means of switching a value of the capacitance according to a switching signal in order to switch the natural angular frequency, and resistance switching means of switching a value of the resistance according to the switching signal in conjunction with switching the value of the capacitance in order to keep the damping factor at a constant value.

According to this configuration, since the natural angular frequency is increased not by switching the current of the charge pump but by switching the capacitance value in the loop filter, the current flowing through the semiconductor substrate in which the PLL circuit is formed is not increased even when increasing the natural angular frequency in order to obtain the high-speed response. Accordingly, when the natural angular frequency is increased to achieve the high-speed response during a frequency pulling, a reduction in operational noise can be achieved.

Preferably, in the PLL circuit of the present invention described above, the capacitance includes a first capacitive element and a second capacitive element which are provided in parallel, and the capacitance switching means is connected between the first capacitive element and the second capacitive element, and includes a switching element for switching a capacitance value that is switched on or off according to the switching signal, and a charge circuit for charging the second capacitive element at the same potential as the first capacitive element when the switching element for switching the capacitance value is in an off-state.

According to this configuration, when connecting the second capacitive element to the first capacitive element for switching the natural angular frequency, since the second capacitive element is charged at the same potential as the first capacitive element, a potential of a connecting point between the first capacitive element and the resistance will not be changed by connecting the second capacitive element to the first capacitive element. The high-speed response may not therefore be impaired.

In the configuration described above, the charge circuit preferably includes a voltage follower to which a potential of the first capacitive element is inputted, and a charge control switching element connected between an output terminal of the voltage follower and the second capacitive element, the charge control switching element being closed when the switching element for switching the capacitance value is in an off state and opened when the switching element for switching the capacitance value is in an on state. In the configuration described above, the voltage follower may be composed of, for example an operational amplifier whose output terminal is connected to an inverting input terminal.

In addition, the charge circuit preferably includes a voltage follower, to which the potential of the first capacitive element is inputted, and the output terminal of which is connected to the second capacitive element, wherein the voltage follower has a function to be in a high impedance output state, the voltage follower being in a normal output state when the switching element for switching the capacitance value is in an off-state and in a high impedance output state when the switching element for switching the capacitance value is in an on-state. In the configuration described above, the voltage follower may be composed of, for example an operational amplifier whose output terminal is connected to the inverting input terminal.

Moreover, according to the PLL circuit described above, in a configuration where the resistance is directly connected to the first capacitive element, and the second capacitive element is connected to a connecting point between the resistance and the first capacitive element via the switching element for switching the capacitance value, the charge circuit may be configured as follows. That is, the charge circuit may include an amplifier circuit for amplifying a potential difference appearing across the resistance using a potential of the connecting point between the first capacitive element and the resistance as a reference, and a charge control switching element connected between an output terminal of the amplifier circuit and the second capacitive element, the charge control switching element being closed when the switching element for switching the capacitance value is in an off state and opened when the switching element for switching the capacitance value is in an on state.

The amplifier circuit described above includes: for example, a first operational amplifier, the output terminal of which being connected to an inverting input terminal, and the noninverting input terminal of which being connected to a connecting point between the resistance and the first capacitive element; a first resistance element, one end of which being connected to the output terminal of the first operational amplifier; a second operational amplifier, the inverting input terminal of which being connected to the other end of the first resistance element, and the noninverting input terminal of which being connected to a terminal opposite to the connecting point of the first capacitive element in the resistance; and a second resistance element connected between the output terminal and the inverting input terminal of said second operational amplifier.

Moreover, according to the PLL circuit described above, in a configuration where the resistance is directly connected to the first capacitive element, and the second capacitive element is connected to a connecting point between the resistance and the first capacitive element via the switching element for switching the capacitance value, the charge circuit may be configured as follows. That is, the charge circuit includes an amplifier circuit for amplifying a potential difference appearing across the resistance using a potential of the connecting point between the first capacitive element and the resistance as a reference, and the output terminal of the amplifier circuit is connected to the second capacitive element. Here, the amplifier circuit has a function to be in a high impedance output state, the voltage follower being in a normal output state when the switching element for switching the capacitance value is in an off-state, and in a high impedance output state when the switching element for switching the capacitance value is in an on-state.

The amplifier circuit described above includes; for example, a first operational amplifier, the output terminal of which being connected to an inverting input terminal, and the noninverting input terminal of which being connected to a connecting point between the resistance and the first capacitive element; a first resistance element, one end of which being connected to the output terminal of the first operational amplifier; a second operational amplifier, the inverting input terminal of which being connected to the other end of the first resistance element, and the noninverting input terminal of which being connected to a terminal opposite to the connecting point of the first capacitive element in the resistance; and a second resistance element connected between the output terminal and the inverting input terminal of said second operational amplifier.

According to the PLL circuit described above, the resistance includes a series circuit of the first resistance element and the second resistance element, and the resistance switching means includes a switching element for switching a resistance value, which is connected in parallel to either the first resistance element or the second resistance element. The switching element for switching the resistance value is in an off-state when the switching element for switching the capacitance value is in an off-state, and is in an on-state when the switching element for switching the capacitance value is in an on-state.

As described above, according to the present invention, even when the natural angular frequency of the PLL circuit is set to a high value during a frequency pulling, a reduction in operational noise of the PLL circuit can be achieved. As a result of this, when circuit blocks such as the transmission circuit and the reception circuit other than the PLL circuit, are integrated on the same semiconductor substrate, deterioration in characteristics of the transmission and reception circuits due to interference can be reduced.

DETAILED DESCRIPTION OF PREFERRED EMBODIMENTS

Figure 1:
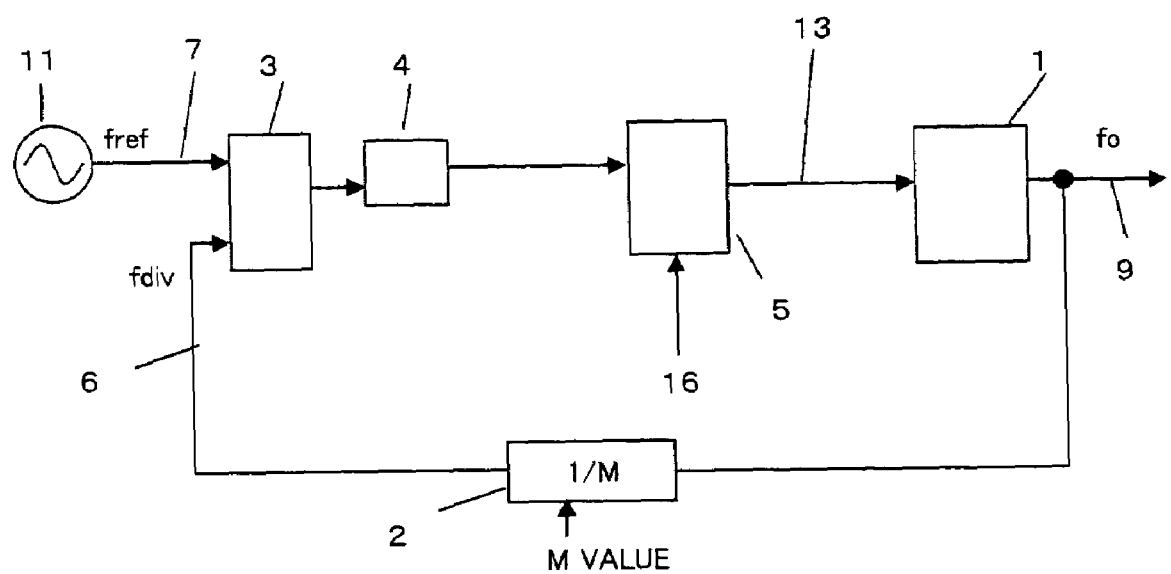
FIG. 1 is a block diagram showing a configuration of a PLL circuit according to a first embodiment of the present invention.

Hereinafter, referring to the drawings, embodiments of the present invention will be explained.

First Embodiment

A PLL circuit according to a first embodiment of the present invention will be explained using FIG. 1 through FIG. 3.

FIG. 1 is a block diagram showing a configuration of the PLL circuit according to the first embodiment of the present invention. FIG. 2 is a circuit diagram showing a configuration of a low pass filter, namely a loop filter, which is one of the components of the PLL circuit in FIG. 1. FIG. 3 is a timing chart showing operation of the PLL circuit according to this embodiment.

According to this PLL circuit, as shown in FIG. 1, a phase difference between a divided signal 6 obtained by dividing an output signal 9 of a voltage controlled oscillator 1 into 1/M by a variable divider 2 and a reference signal 7 outputted from a temperature compensated crystal oscillator 11 is detected by a phase comparator 3. A voltage pulse with a pulse width according to the phase difference between the divided signal 6 and the reference signal 7, the phase difference having been detected by the phase comparator 3, is sent to a charge pump 4 from the phase comparator 3. The charge pump 4 outputs a voltage or a current according to an output of the phase comparator 3. The charge pump 4 is directly connected to a loop filter 5. An output of this charge pump 4 is smoothed by the loop filter 5 and transmitted to the voltage controlled oscillator 1 as a control voltage 13.

A natural angular frequency switching signal 16 is inputted into the loop filter 5, and values of a resistance and a capacitance composing the loop filter 5 are switched depending on a state of the natural angular frequency switching signal 16. This is because of switching a natural angular frequency $\omega n$, while keeping a damping factor $\zeta$ of the PLL circuit constant.

Figure 2:
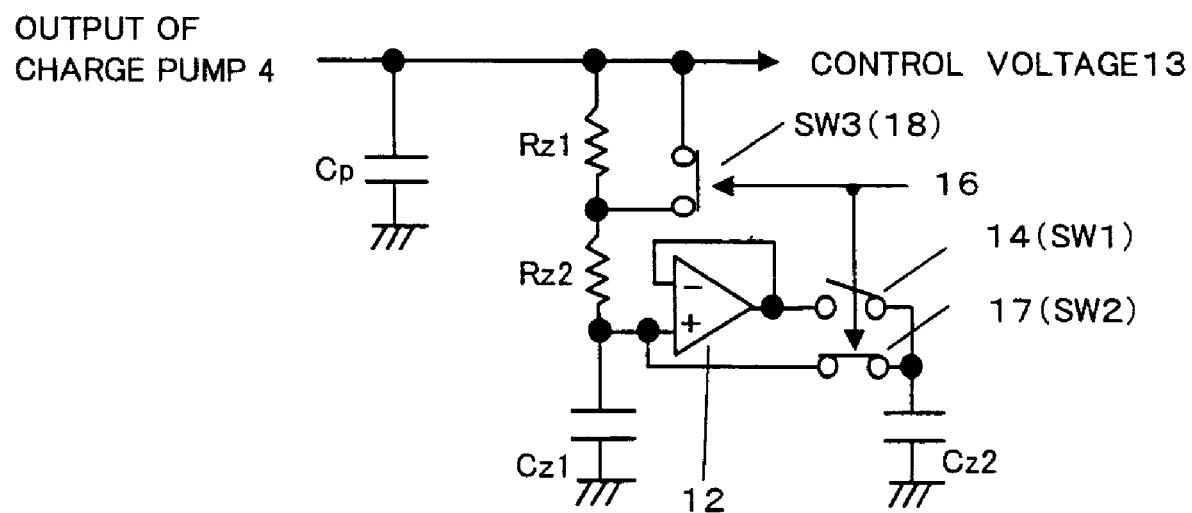
FIG. 2 is a circuit diagram showing a configuration of a loop filter in the PLL circuit according to the first embodiment of the present invention.

As shown in FIG. 2, the loop filter 5 described above includes: a capacitive element Cp connected between an output terminal of the charge pump 4 and a ground; a series circuit of resistance elements Rz1 and Rz2, and a capacitive element Cz1 connected between the output terminal of the charge pump 4 and the ground; an operational amplifier 12 whose noninverting input terminal is connected to a connecting point between the resistance element Rz2 and the capacitive element Cz1; a switching element (SW1) 14, one end of which being connected to an output terminal of the operational amplifier 12; a capacitive element Cz2 connected between the other end of the switching element (SW1) 14 and the ground; a switching element (SW2) 17 connected between the connecting point of the resistance element Rz2 and the capacitive element Cz1, and the capacitive element Cz2; and a switching element (SW3) 18 connected in parallel to the resistance element Rz1.

The operational amplifier 12 whose output terminal and inverting input terminal are mutually connected composes a voltage follower. This voltage follower composes a charge circuit for charging the capacitive element Cz2 in conjunction with the switching element (SW1) 14.

The switching elements (SW1, SW2, SW3) 14, 17, and 18 are switched on or off depending on the state of the natural angular frequency switching signal 16. The output terminal of the charge pump 4 is connected to a control voltage terminal of the voltage controlled oscillator 1 as it is.

According to such a configuration as described above, the output signal 9 of the voltage controlled oscillator 1 is divided by the variable divider 2, and fed back to the phase comparator 3 as the divided signal 6. Accordingly, supposing that a frequency division ratio of the variable divider 2 is M, and a frequency of the reference signal 7 is fref, a frequency fo of the output signal 9 of the voltage controlled oscillator 1 is expressed by Equation (1) in a manner similar to the conventional art.

In order to achieve both of the high-speed response and the high C/N ratio, the natural angular frequency $\omega n$ is switched in a frequency pulling and a steady state also in this embodiment.

First, during a steady state, the natural angular frequency switching signal 16 stays in "L" level, so that the switching element (SW1) 14 is switched off, and the switching element (SW2) 17 and the switching element (SW3) 18 are switched on. Accordingly, the natural angular frequency of the PLL circuit is in a low state, and the PLL circuit is kept in a locked state.

Subsequently, when switching the frequency division ratio M of the variable divider 2, the natural angular frequency switching signal 16 rises to "H" level for a certain period from its moment. In response to this natural angular frequency switching signal 16, the switching element (SW1) 14 is switched on, and the switching element (SW2) 17 and the switching element (SW3) 18 are switched off. As a result of this, a capacitance value that is a factor for determining the natural angular frequency $\omega n$ changes to a value of only Cz1 from a value of Cz1+Cz2, so that the natural angular frequency $\omega n$ is increased according to Equation (2). At this time, the value of the capacitance which is the factor for determining a damping factor $\zeta$ changes to the value of only Cz1 from the value of Cz1+Cz2, so that the damping factor $\zeta$ tends to change. However, a resistance value that is another factor for determining the damping factor $\zeta$ changes to a value of Rz1+Rz2 from a value of Rz2. Thus, even when the natural angular frequency ωn is increased according to Equation (3), the damping factor ζ is kept at a constant value, that is, a value of approximately 0.7. It should be noted that even in a moment when the PLL circuit is released from a sleep mode, since the natural angular frequency switching signal 16 rises to "H" level, the same operation as described above is carried out.

The PLL circuit in which the natural angular frequency ωn is increased will be in a state of the high-speed response, and is led to converge to a desired control voltage 13 in a short time. Typically, when the PLL circuit is in a steady state, a potential across the resistance elements Rz1 and Rz2 will be approximately 0 volt. In other words, it means that the control voltage 13 becomes almost equal to a potential across the capacitive element Cz1. A voltage equal to the voltage of this capacitive element Cz1 is charged to the capacitive element Cz2 via the operational amplifier 12 and the switching element (SW1) 14.

After the passage of a certain predetermined time, the natural angular frequency switching signal 16 is switched to "L" level. The switching element (SW2) 17 is switched on in response to this signal, so that the capacitive element Cz2 charged to the same potential as the capacitive element Cz1 will be connected in parallel to the capacitive element Cz1. As a result of this, the capacitance value that used to be only Cz1 will be increased to Cz1+Cz2, and the natural angular frequency ωn will be decreased according to Equation (2). At the same time, the resistance value that used to be Rz2+Rz1 will be decreased by the resistance value of Rz1, so that the damping factor ζ can be kept at approximately 0.7 according to Equation (3).

Incidentally, the certain time for the natural angular frequency switching signal 16 to keep "H" level will be satisfied with a time for the control voltage 13 to become approximately a desired voltage, and a time until the output current of the charge pump 4 charges the capacitive element Cz1 to a desired voltage will serve as a guide in DC. Meanwhile, in order to suppress for the input current to degrade various characteristics of the PLL circuit, a CMOS type operational amplifier will be desired as the operational amplifier 12. Additionally, when the voltage of the capacitive element Cz1 no longer charges the capacitive element Cz2 accurately, the frequency stability immediately after switching the natural angular frequency switching signal 16 to "L" level from "H" level will be deteriorated, thereby affecting the high-speed response. Preferably, the operational amplifier 12 will therefore be a low offset voltage type operational amplifier.

Figure 3:
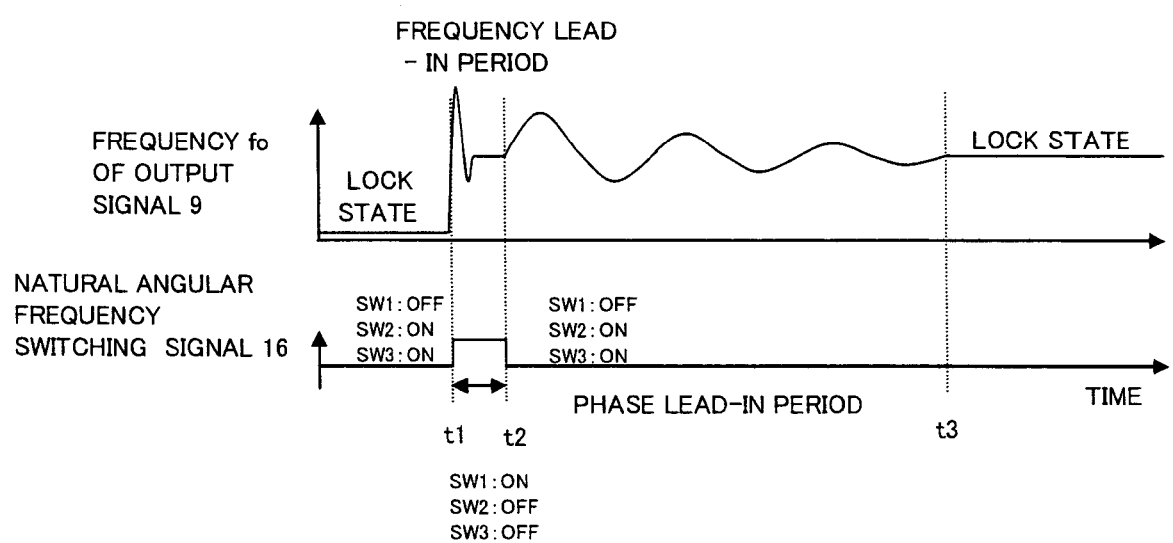
FIG. 3 is a timing chart showing operation of the PLL circuit of the first, a third, a fifth, and a seventh embodiments of the present invention.

A relationship between a change of the frequency fo of the output signal of the voltage controlled oscillator 1, and a change of the natural angular frequency switching signal 16 is shown in FIG. 3. In FIG. 3, the frequency fo is stable before time t1, and the PLL circuit stays in a locked state. A period from time t1 to time t2 is a frequency pulling period. A period from time t2 to time t3 is a phase pulling period. After time t3, the frequency fo is stable and the PLL circuit enters a locked state.

The operation described above will be summarized as follows. In the PLL circuit according to the first embodiment of the present invention shown in FIG. 1 through FIG. 3, switching the output current of the charge pump 4 is stopped, and during a certain period of time from the moment when the frequency division ratio M of the variable divider 2 is switched until the natural angular frequency switching signal 16 is keeping "H" level, the switching element (SW1) 14 is switched on and the switching element (SW2) 17 is switched off in response to this signal, and the capacitive element Cz2 is charged so as to be the same potential as the charged potential of the capacitive element Cz1. Additionally, the switching element (SW3) 18 is switched off during this period, so that the damping factor ζ is adjusted to approximately 0.7 in a state where the natural angular frequency ωn is increased.

Subsequently, the natural angular frequency switching signal 16 changes to "L" level, and in response to this signal, the switching element (SW1) 14 is switched off, and the switching element (SW2) 17 is switched on, so that the capacitive element Cz2 charged to the same potential as the capacitive element Cz1 will be connected in parallel to the capacitive element Cz1. Moreover, the switching element (SW3) 18 simultaneously is switched on, so that the natural angular frequency ωn is reduced, while keeping the damping factor ζ at approximately 0.7. For example, the capacitance value Cz is set to 1/4 times thereof and the resistance value Rz is set to 2 times thereof only during a frequency pulling, so that the natural angular frequency ωn can be increased by two times, while keeping the damping factor ζ constant according to Equations (2) and (3).

According to this embodiment of the present invention, not by switching the current of the charge pump as the conventional art, but by switching the value of the capacitance in the loop filter 5, the natural angular frequency ωn is increased, so that the current flowing through the semiconductor substrate in which the PLL circuit is formed is not increased even when the natural angular frequency ωn is increased in order to obtain the high-speed response. Accordingly, when the natural angular frequency is increased and the high-speed response is increased, a reduction in operational noise can be achieved.

Moreover, when additionally connecting the capacitive element Cz2 in order to return the natural angular frequency ωn, the capacitive element Cz2 is additionally connected after charging the capacitive element Cz2 at the same potential as the capacitive element Cz1. For that reason, when the circuit of only the capacitive element Cz1 is switched to the parallel circuit of the capacitive elements Cz1 and Cz2, the potential of the connecting point between the capacitive element Cz1 and the resistance element Rz2 will not be fluctuated. Thus, the high-speed response may not be impaired.

In summary, it is concluded that while keeping the high-speed response and the high C/N ratio during a steady state, interference against other blocks, such as the transmission circuit and the reception circuit integrated on the same semiconductor substrate can be reduced, thereby making it possible to prevent deterioration in various-characteristics of the transmission and reception circuits.

Second Embodiment

Figure 4:
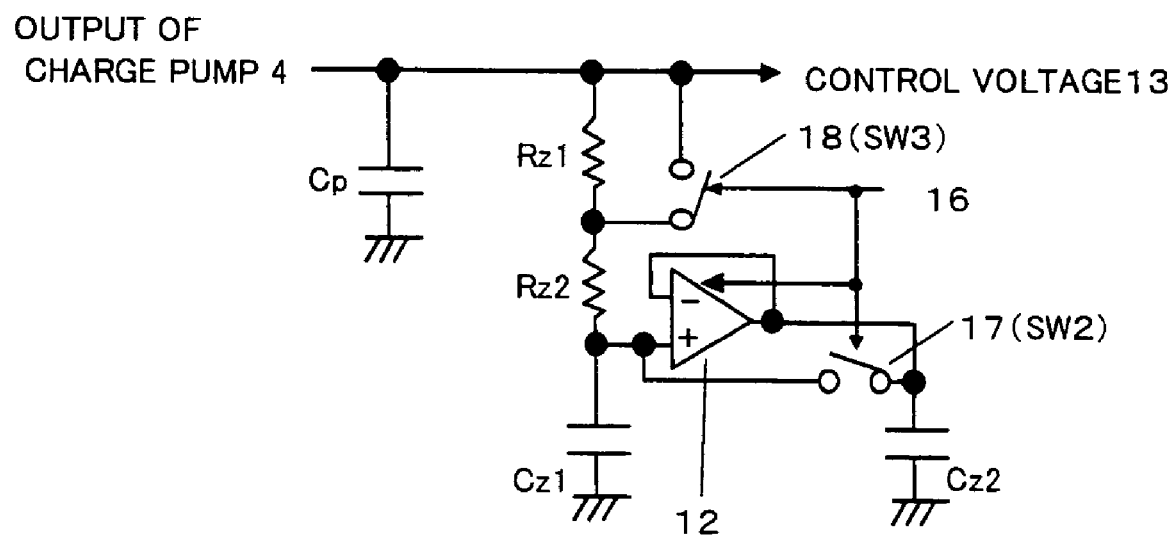
FIG. 4 is a circuit diagram showing a configuration of a loop filter in a PLL circuit according to a second embodiment of the present invention.
Figure 5:
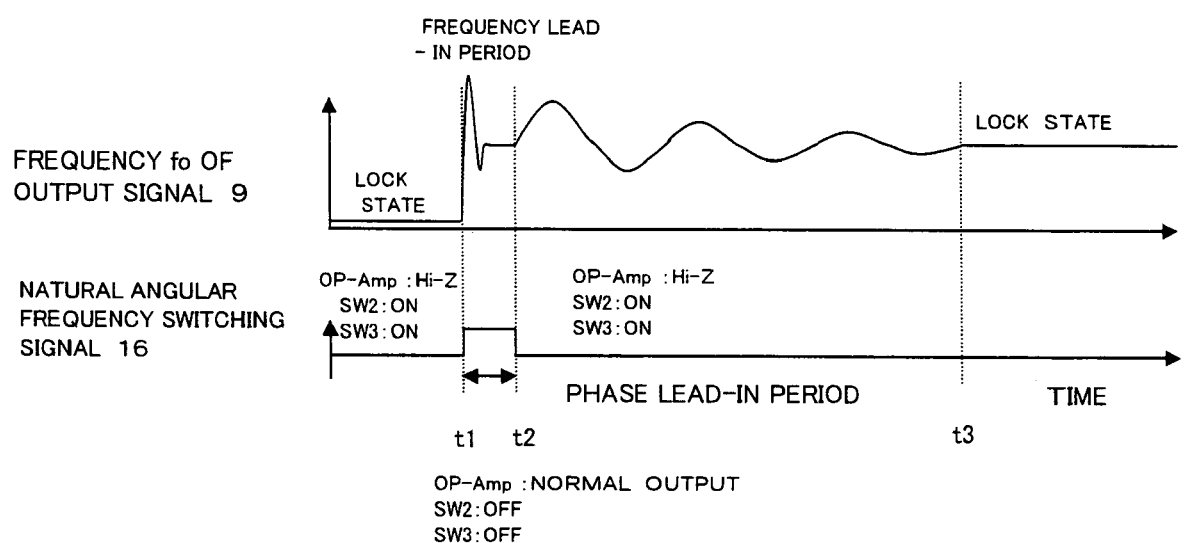
FIG. 5 is a timing chart showing operation of the PLL circuit of the second, a fourth, a sixth, and an eighth embodiment of the present invention.

A PLL circuit according to a second embodiment of the present invention will be explained using FIG. 4 and FIG. 5. An entire configuration of the PLL circuit of this embodiment is similar to that shown in FIG. 1 for the first embodiment. Only the internal configuration of the loop filter is different from that of the first embodiment. FIG. 4 is a circuit diagram showing a configuration of the loop filter which is one of the components of the PLL circuit of this embodiment. FIG. 5 is a timing chart showing operation of the PLL circuit according to the second embodiment of the present invention.

According to the second embodiment of the present invention, the switching element (SW1) 14 is not required as compared with the first embodiment of the present invention. Instead of that, however, a function not to transmit the output voltage of the operational amplifier 12 to the capacitive element Cz2 is required. For this reason, the operational amplifier 12 used in the second embodiment of the present invention is required to make the output become a high impedance (Hi-Z) state.

The detail of the operation is completely the same as that of the first embodiment of the present invention except for making the output of the operational amplifier 12 become a high impedance (Hi-Z) state at a timing when the switching element (SW1) 14 is switched off in the first embodiment of the present invention.

A relationship between a change of the frequency fo of the output signal of the voltage controlled oscillator 1, and a change of the natural angular frequency switching signal 16 is shown in FIG. 5. In FIG. 5, the frequency fo is stable before time t1, and the PLL circuit stays in a locked state. A period from time t1 to time t2 is a frequency pulling period. A period from time t2 to time t3 is a phase pulling period. After time t3, the frequency fo is stable and the PLL circuit enters a locked state.

According to this embodiment, the same effect as that of the first embodiment can be achieved.

Third Embodiment

Figure 6:
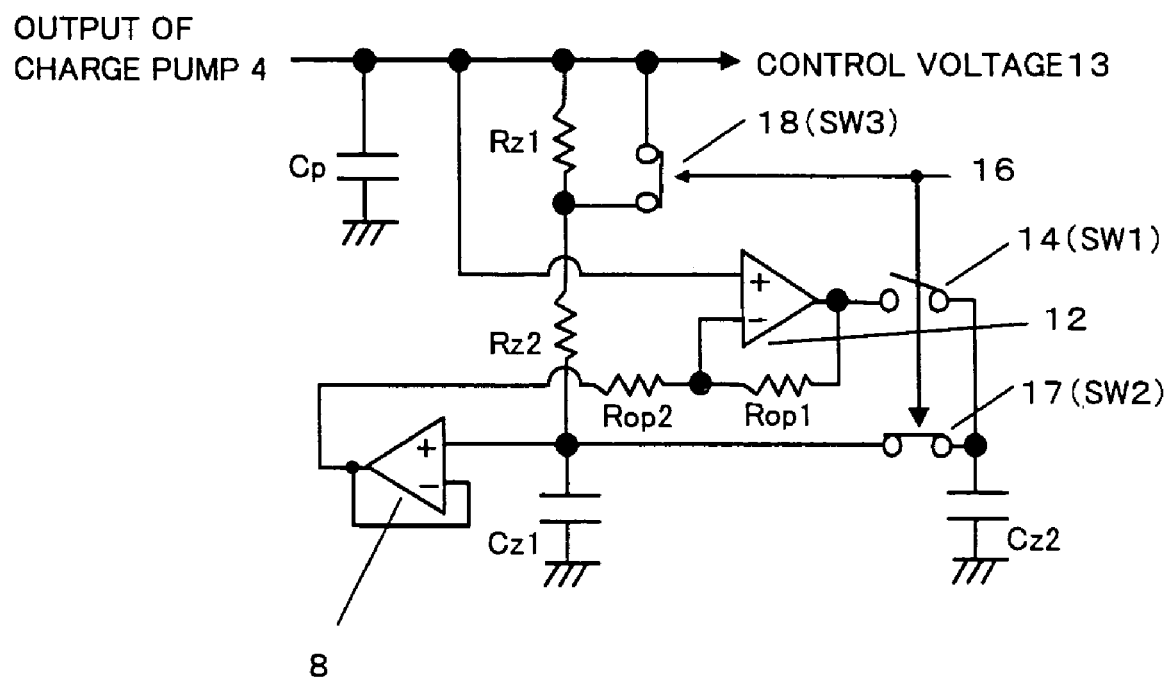
FIG. 6 is a circuit diagram showing a configuration of a loop filter in the PLL circuit according to the third embodiment of the present invention.

A PLL circuit according to a third embodiment of the present invention will be explained using FIG. 6 and FIG. 3. An entire configuration of the PLL circuit of this embodiment is similar to that shown in FIG. 1 for the first embodiment. Only the internal configuration of the loop filter is different from that of the first embodiment. FIG. 6 is a circuit diagram showing a configuration of the loop filter which is one of the components of the PLL circuit of this embodiment.

This embodiment has following different points from a view point of the configuration as compared with the first embodiment of the present invention. That is, according to this embodiment, instead of the voltage follower composed of the operational amplifier 12, a noninverting amplifier composed of the operational amplifier 12 and resistance elements Rop1 and Rop2, and a voltage follower composed of an operational amplifier 8 are employed. This noninverting amplifier and the voltage follower compose a charge circuit for charging the capacitive element Cz2 in conjunction with the switching element (SW1) 14.

As shown in FIG. 6, the loop filter 5 described above includes the capacitive element Cp connected between the output terminal of the charge pump 4 and the ground, the series circuit of the resistance elements Rz1 and Rz2, and the capacitive element Cz1 connected between the output terminal of the charge pump 4 and the ground, the operational amplifier 8 whose noninverting input terminal is connected to the connecting point between the resistance element Rz2 and the capacitive element Cz1, the resistance element Rop2, one end of which being connected to an output terminal of the operational amplifier 8, the operational amplifier 12 whose inverting input terminal is connected to the other end of the resistance element Rop2, the resistance element Rop1 connected between the output terminal and the inverting input terminal of the operational amplifier 12, the switching element (SW1) 14, one end of which being connected to the output terminal of the operational amplifier 12, the capacitive element Cz2 connected between the other end of the switching element (SW1) 14 and the ground, the switching element (SW2) 17 connected between the connecting point of the resistance element Rz2 and the capacitive element Cz1, and the capacitive element Cz2, and the switching element (SW3) 18 connected in parallel to the resistance element Rz1.

The noninverting input terminal of the operational amplifier 12 is connected to a terminal opposite to the capacitive element Cz1 in the series circuit of the resistance elements Rz1 and Rz2, and the operational amplifier 12 amplifies a voltage appearing across the series circuit of the resistance elements Rz1 and Rz2, and provides it to the capacitive element Cz2.

The operational amplifier 8 whose output terminal and inverting input terminal are mutually connected composes a voltage follower.

The voltage follower and the noninverting amplifier described above compose a charge circuit for charging the capacitive element Cz2 in conjunction with the switching element (SW1) 14.

The switching elements (SW1, SW2, SW3) 14, 17, and 18 are switched on or off depending on the state of the natural angular frequency switching signal 16. The output terminal of the charge pump 4 is connected to the control voltage terminal of the voltage controlled oscillator 1 as it is.

According to the first embodiment of the present invention, when switching the capacitance value of the loop filter 5 to Cz1+Cz2 from Cz1, the potential across the capacitive element Cz1 has been directly applied to the capacitive element Cz2 using the voltage follower composed of the operational amplifier 12, so that the capacitive element Cz2 has been charged, and the capacitance value has subsequently been switched to the large value.

On the contrary, according to the third embodiment of the present invention, the PLL circuit charges the capacitive element Cz2 during a steady state by utilizing that the potential across the resistance elements Rz1 and Rz2 becomes approximately 0 volt, and the capacitance value is subsequently switched to the large value.

When the natural angular frequency switching signal 16 is in "H" level, the switching element (SW3) 18 is switched off. At this time, by considering the potential of the connecting point between the capacitive element Cz1 and the resistance element Rz2 as a reference voltage, supposing that a potential across the resistance elements Rz2+Rz1 is VRz, the control voltage 13 is Vt, and a potential of the capacitive element Cz is Vcz, an output voltage Vout of the noninverting amplifier composed of the operational amplifier 12 and the resistance elements Rop1 and Rop2 will be expressed by a following equation.

$$Vout = \{(Vcz-Vt)/Rop2\} \times Rop1 + Vt \qquad \text{Equation (4)}$$

As operation of this noninverting amplifier, the same potential as that on a noninverting input terminal appears on the inverting input terminal of the operational amplifier 12 due to an imaginary short-circuit effect of a negative feedback. For this reason, a current according to the potential difference between the voltage Vt and the voltage Vcz flows through the resistance element Rop2. This current also flows to the resistance element Rop1. As a result, the voltage Vout will be given by Equation (4). Moreover, considering that the potential across the resistance elements Rz1 and Rz2 will be approximately 0 volt during a steady state in the PLL circuit, it means that the potential across the capacitive element Cz1 appears as the voltage Vout during a steady state. As a result of this, in a manner similar to the first embodiment of the present invention, when switching the capacitance value to Cz1+Cz2 from Cz1, the capacitance value can be switched to the large value after charging the capacitive element Cz2 at the same potential as the capacitive element Cz1.

An effect of this embodiment is similar to that of first embodiment.

Fourth Embodiment

Figure 7:
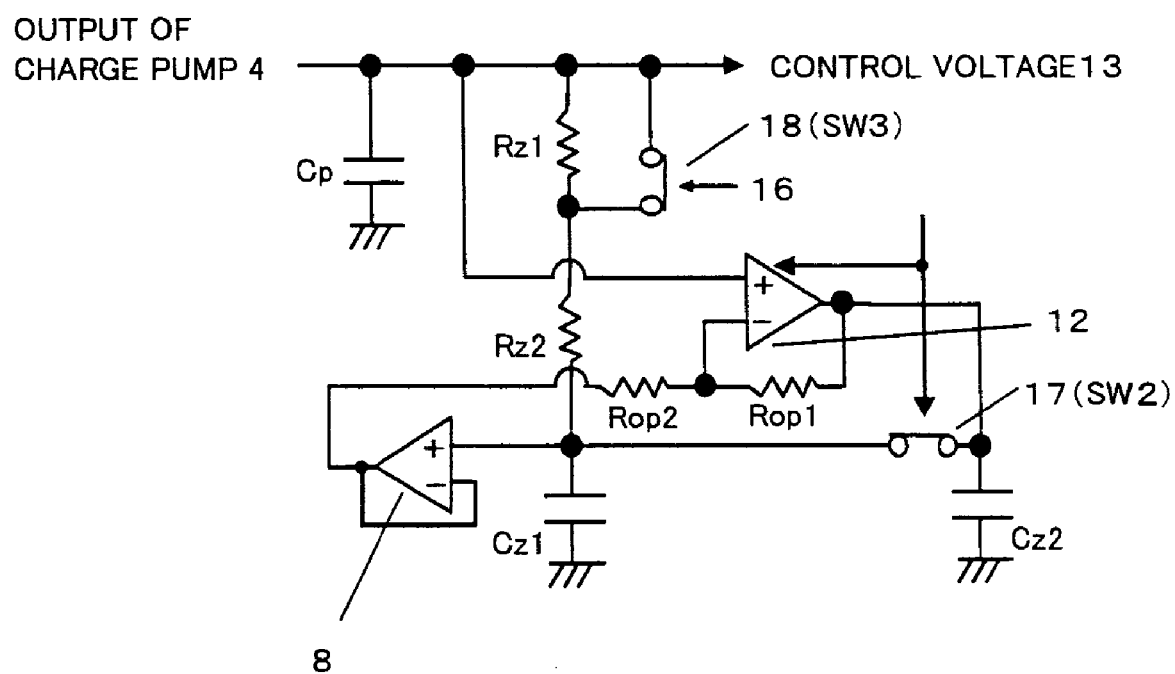
FIG. 7 is a circuit diagram showing a configuration of a loop filter in the PLL circuit according to the fourth embodiment of the present invention.

A PLL circuit according to a fourth embodiment of the present invention will be explained using FIG. 7 and FIG. 5. An entire configuration of the PLL circuit of this embodiment is similar to that shown in FIG. 1 for the first embodiment. Only the internal configuration of the loop filter is different from that of the first embodiment. FIG. 7 is a circuit diagram showing a configuration of the loop filter which is one of the components of the PLL circuit of this embodiment.

According to the fourth embodiment of the present invention, the switching element (SW1) 14 is not required as compared with the third embodiment of the present invention. However, a function not to transmit the output voltage of the operational amplifier 12 to the capacitive element Cz2 is required instead of that. For this reason, the operational amplifier 12 used in the fourth embodiment of the present invention is required to make the output become a high impedance state.

The detail of the operation is completely the same as that of the third embodiment of the present invention except for making the output of the operational amplifier 12 become a high impedance state at a timing when the switching element (SW1) 14 is switched off in the third embodiment of the present invention.

An effect of this embodiment is similar to that of first embodiment.

Fifth Embodiment

Figure 8:
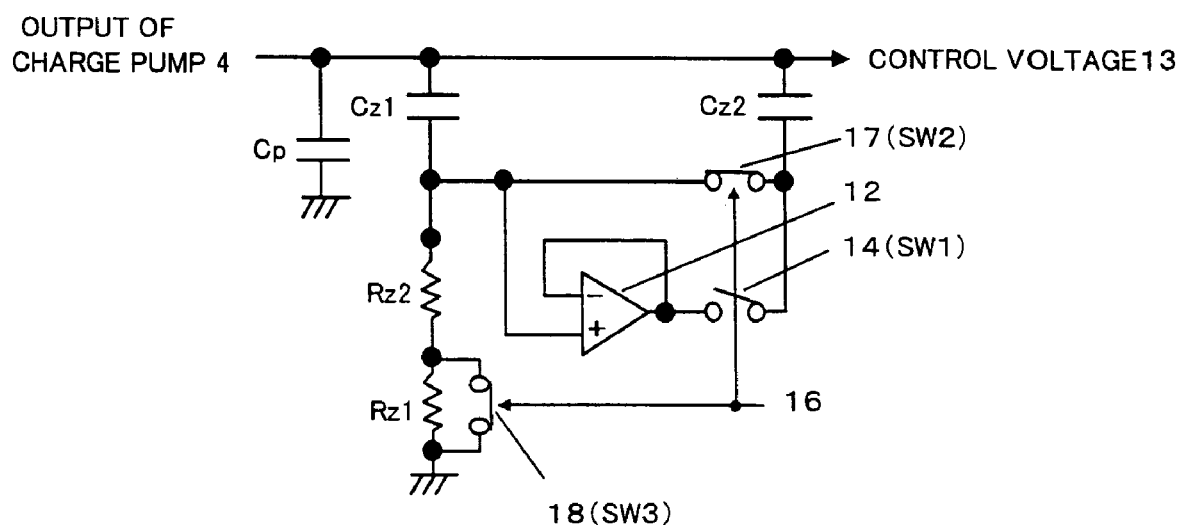
FIG. 8 is a circuit diagram showing a configuration of a loop filter in the PLL circuit according to the fifth embodiment of the present invention.

A PLL circuit according to a fifth embodiment of the present invention will be explained using FIG. 8 and FIG. 3. An entire configuration of the PLL circuit of this embodiment is similar to that shown in FIG. 1 for the first embodiment. Only the internal configuration of the loop filter is different from that of the first embodiment. FIG. 8 is a circuit diagram showing a configuration of the loop filter which is one of the components of the PLL circuit of this embodiment.

According to the fifth embodiment of the present invention shown in FIG. 8, a circuit connection in which the resistance elements Rz1 and Rz2, and the capacitive element Cz1 are connected in series is reversed to the ground as compared with the first through fourth embodiments of the present invention. In other words, the resistance element Rz1 is grounded, and the capacitive element Cz1 is connected to the output terminal of the charge pump 4. The operation, however, is completely the same as that of the first embodiment of the present invention, and that the capacitance value is switched to the large value after charging the capacitive element Cz2 at the same potential as the capacitive element Cz1 when switching the capacitance value being a fundamental requirement to Cz1+Cz2 from Cz1 is the same as that of the first embodiment of the present invention.

An effect of this embodiment is similar to that of first embodiment.

Sixth Embodiment

Figure 9:
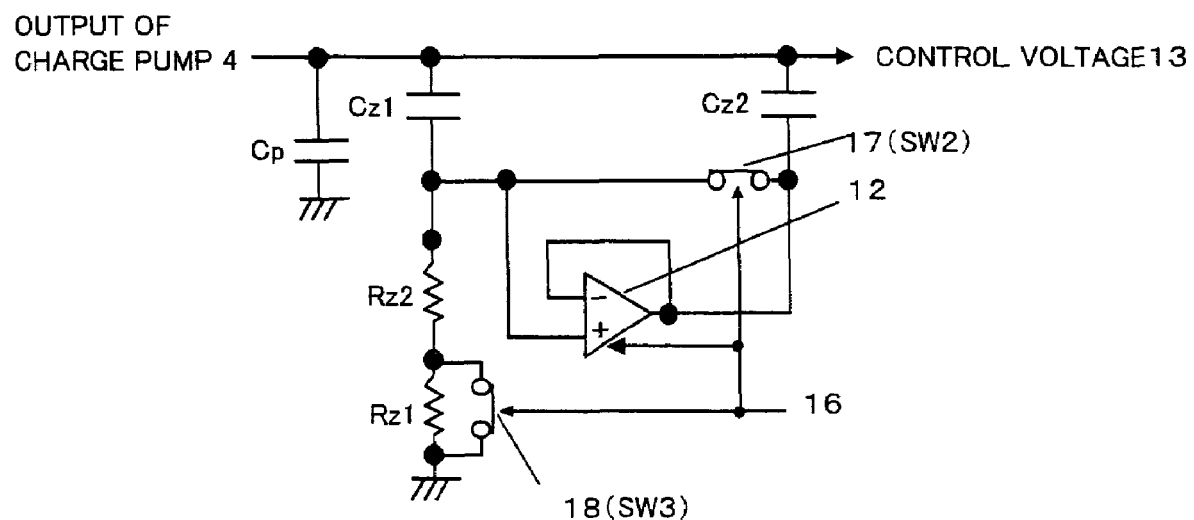
FIG. 9 is a circuit diagram showing a configuration of a loop filter in the PLL circuit according to the sixth embodiment of the present invention.

A PLL circuit according to a sixth embodiment of the present invention will be explained using FIG. 9 and FIG. 5. An entire configuration of the PLL circuit of this embodiment is similar to that shown in FIG. 1 for the first embodiment. Only the internal configuration of the loop filter is different from that of the first embodiment. FIG. 9 is a circuit diagram showing a configuration of the loop filter which is one of the components of the PLL circuit of this embodiment.

According to the sixth embodiment of the present invention, the switching element (SW1) 14 is not required as compared with the fifth embodiment of the present invention. However, a function not to transmit the output voltage of the operational amplifier 12 to the capacitive element Cz2 is required instead of that. For this reason, the operational amplifier 12 used in the sixth embodiment of the present invention is required to make the output become a high impedance state.

The detail of the operation is completely the same as that of the fifth embodiment of the present invention except for making the output of the operational amplifier 12 become a high impedance state at a timing when the switching element (SW1) 14 is switched off in the fifth embodiment of the present invention.

An effect of this embodiment is similar to that of first embodiment.

Seventh Embodiment

Figure 10:
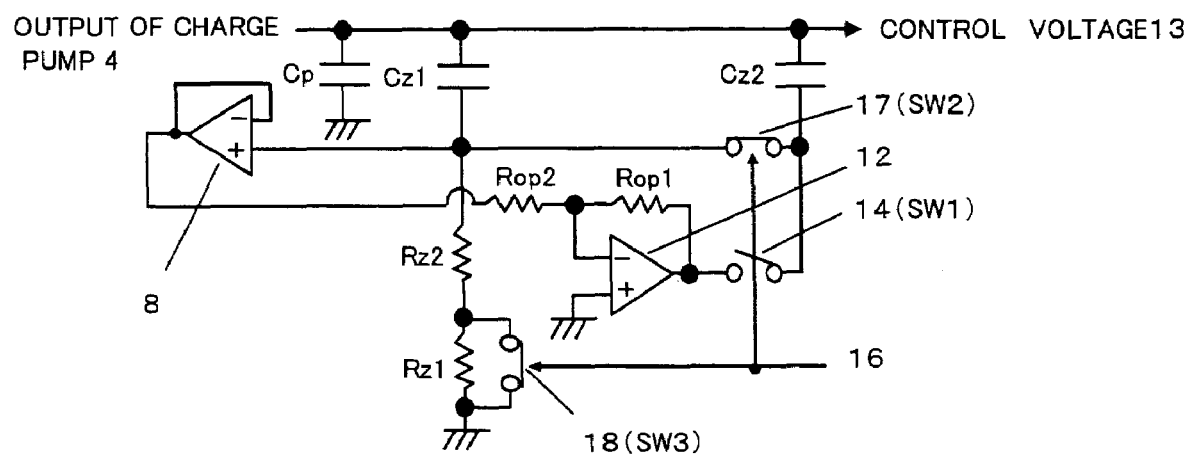
FIG. 10 is a circuit diagram showing a configuration of a loop filter in the PLL circuit according to the seventh embodiment of the present invention.

A PLL circuit according to a seventh embodiment of the present invention will be explained using FIG. 10 and FIG. 3. An entire configuration of the PLL circuit of this embodiment is similar to that shown in FIG. 1 for the first embodiment. Only the internal configuration of the loop filter is different from that of the first embodiment. FIG. 10 is a circuit diagram showing a configuration of the loop filter which is one of the components of the PLL circuit of this embodiment.

According to the seventh embodiment of the present invention shown in FIG. 10, a circuit connection in which the resistance elements Rz1 and Rz2, and the capacitive element Cz1 are connected in series is reversed to the ground as compared with the first through fourth embodiments of the present invention. In other words, the resistance element Rz1 is grounded, and the capacitive element Cz1 is connected to the output terminal of the charge pump 4. The operation, however, is completely the same as that of the third embodiment of the present invention, and that the capacitance value is switched to the large value after charging the capacitive element Cz2 at the same potential as the capacitive element Cz1 when switching the capacitance value that is a fundamental requirement to Cz1+Cz2 from Cz1 is the same as that of the first embodiment of the present invention.

An effect of this embodiment is similar to that of first embodiment.

Eighth Embodiment

Figure 11:
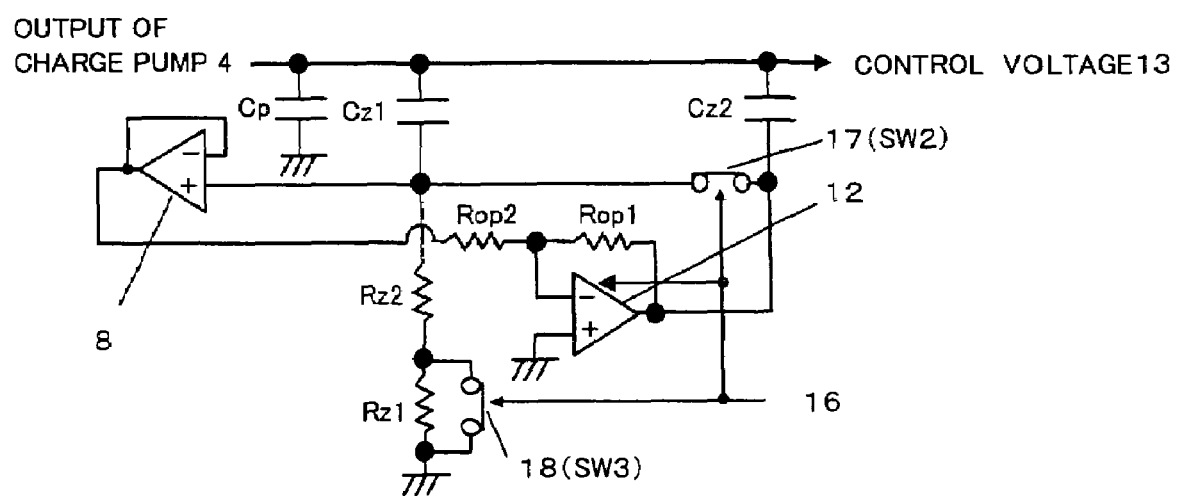
FIG. 11 is a circuit diagram showing a configuration of a loop filter in the PLL circuit according to the eighth embodiment of the present invention.
Figure 12:
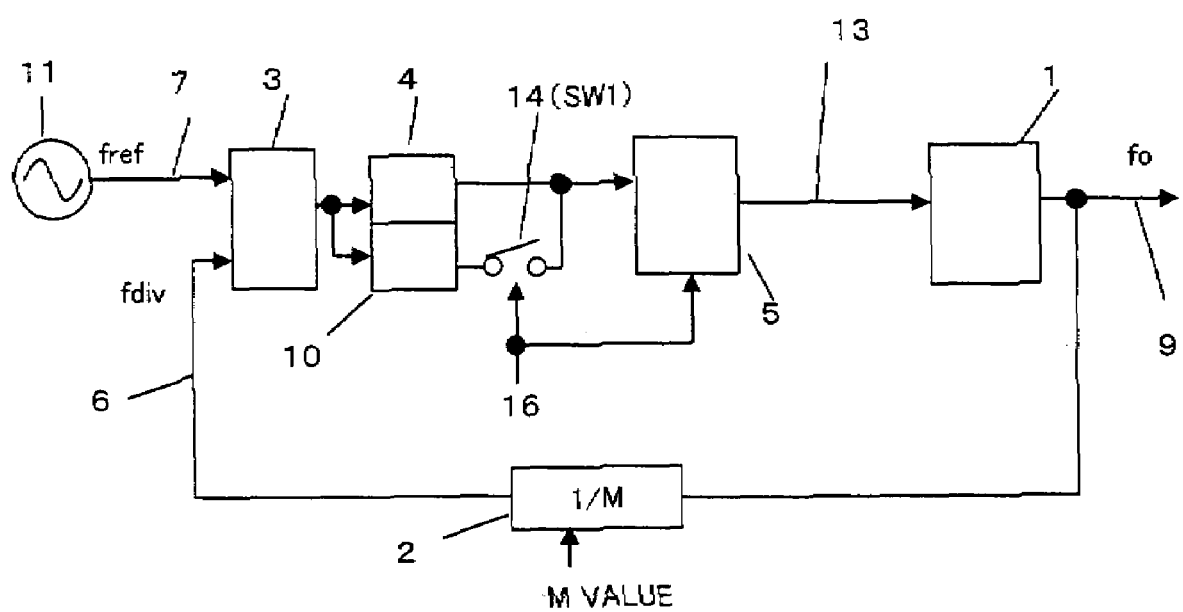
FIG. 12 is a block diagram showing a configuration of a PLL circuit according to a conventional art.
Figure 13:
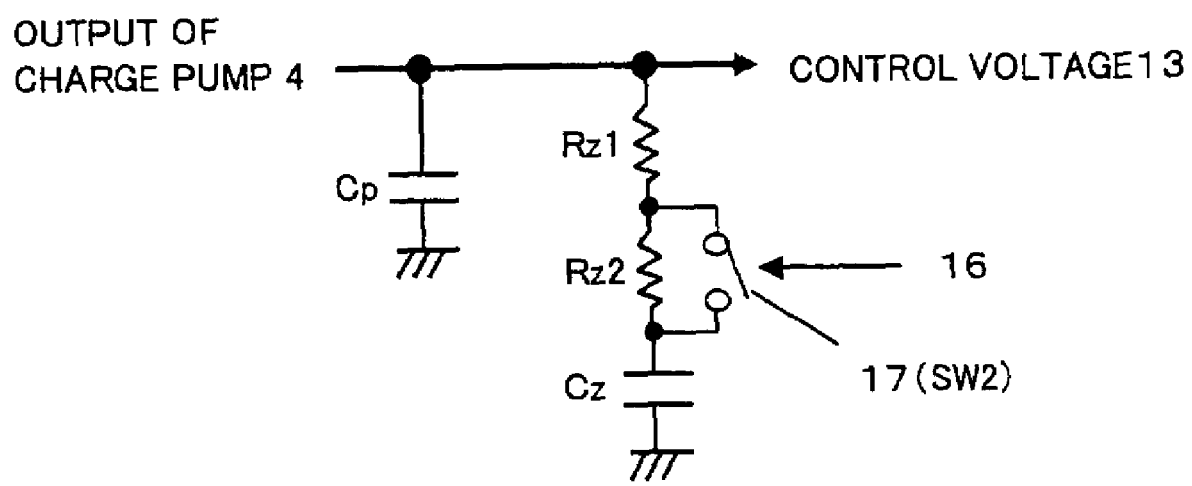
FIG. 13 is a circuit diagram showing a configuration of a loop filter in the PLL circuit according to the conventional art.
Figure 14:
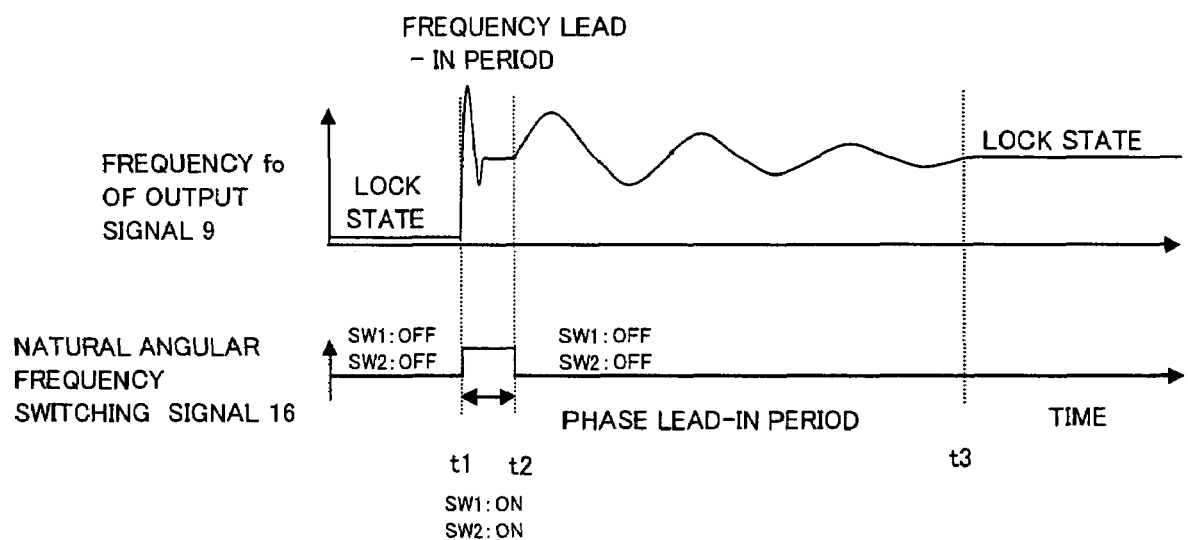
FIG. 14 is a timing chart showing operation of the PLL circuit according to the conventional art.
Figure 15:
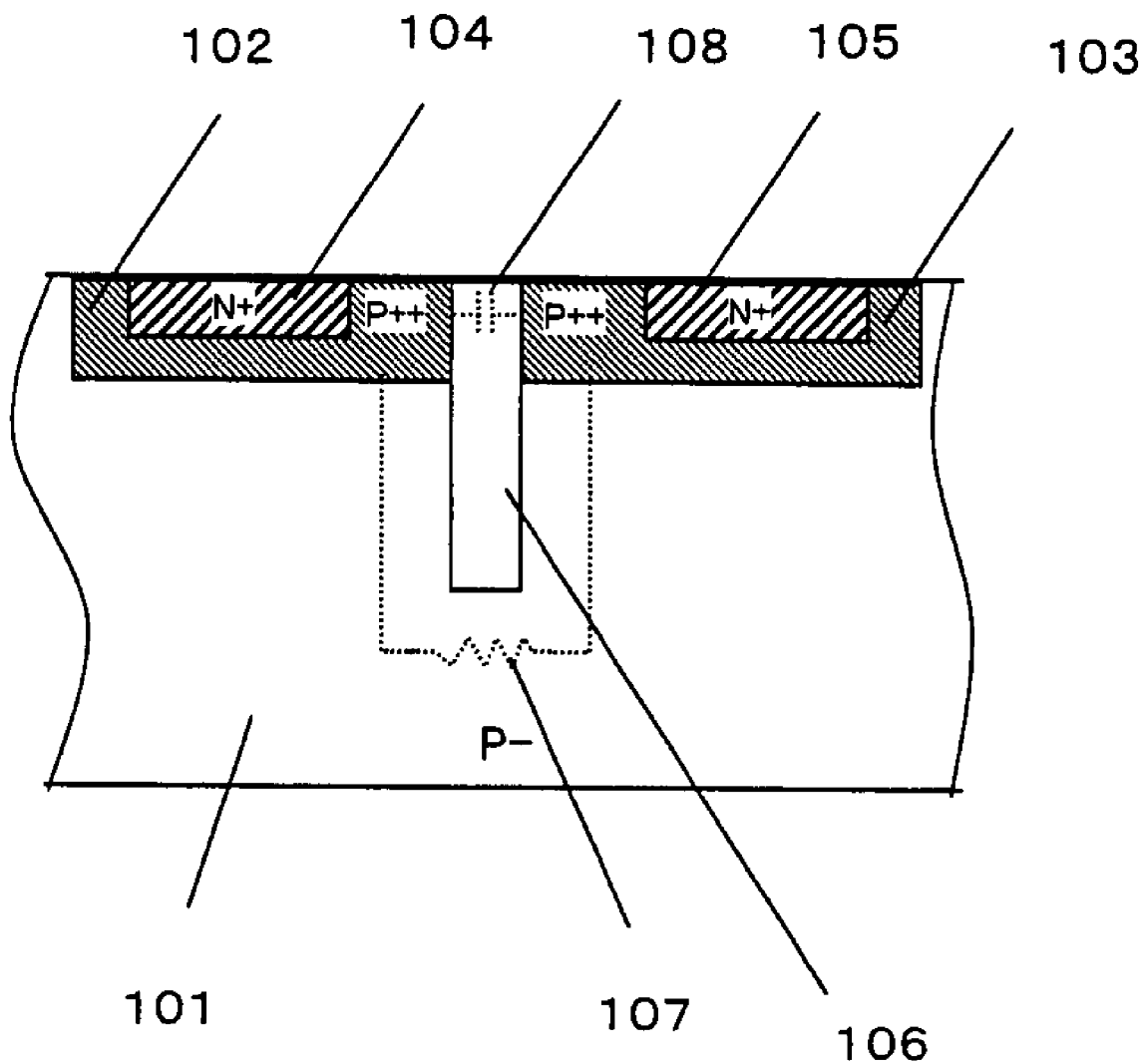
FIG. 15 is a longitudinal sectional view showing a structure of a semiconductor device.

A PLL circuit according to an eighth embodiment of the present invention will be explained using FIG. 11 and FIG. 5. An entire configuration of the PLL circuit of this embodiment is similar to that shown in FIG. 1 for the first embodiment. Only the internal configuration of the loop filter is different from that of the first embodiment. FIG. 11 is a circuit diagram showing a configuration of the loop filter which is one of the components of the PLL circuit of this embodiment.

According to the eighth embodiment of the present invention, the switching element (SW1) 14 is not required as compared with the seventh embodiment of the present invention. However, a function not to transmit the output voltage of the operational amplifier 12 to the capacitive element Cz2 is required instead of that. For this reason, the operational amplifier 12 used in the eighth embodiment of the present invention is required to make the output become a high impedance state.

The detail of the operation is completely the same as that of the seventh embodiment of the present invention except for making the output of the operational amplifier 12 become a high impedance state at a timing when the switching element (SW1) 14 is switched off in the seventh embodiment of the present invention.

An effect of this embodiment is similar to that of first embodiment.

INDUSTRIAL AVAILABILITY

As described above, according to the present invention, a reduction in operational noise of the PLL circuit is achieved, and deterioration in various characteristics of the transmission and reception circuits due to interference when other circuit blocks such as the transmission circuit and the reception circuit other than the PLL circuit are integrated on the same semiconductor substrate as the PLL circuit can be reduced.

What is claimed is:

1. A PLL circuit comprising at least: a voltage controlled oscillator; a phase comparator for comparing phases between an output signal of said voltage controlled oscillator and a reference signal; and a loop filter for providing a low-pass component of an output signal of said phase comparator to said voltage controlled oscillator as a control voltage, wherein the PLL circuit operates at a predetermined natural angular frequency and a predetermined damping factor, wherein said loop filter includes: a series circuit of a capacitance and a resistance connected to an output terminal of said phase comparator; in order to switch said natural angular frequency, capacitance switching section that switches a value of said capacitance according to a switching signal; and in order to keep said damping factor at a constant value, resistance switching section that switches a value of said resistance according to said switching signal in conjunction with switching the value of said capacitance, wherein said capacitance includes a first and a second capacitive elements being connected in parallel, wherein said capacitance switching section includes: a switching element for switching the capacitance value, one end of which being directly-connected to one end of said first capacitive element and another end of which being directly-connected to one end of said second capacitive element; and a charge circuit, input of which being directly-connected to said one end of said first capacitive element and output of which being directly-connected to said one end of said second capacitive element, wherein said resistance is connected to said one end of said first capacitive element, said switching element for switching the capacitance value switches to an on-state or an off-state according to said switching signal, and said charge circuit charges said second capacitive element at the same potential as said first capacitive element when said switching element for switching the capacitance value is switched off.

2. The PLL circuit according to claim 1, wherein said charge circuit comprises: a voltage follower, to which a potential of said first capacitive element being inputted; and a charge control switching element connected between an output terminal of said voltage follower and said one end of said second capacitive element, said charge control switching element is in an on-state when said switching element for switching the capacitance value is in an off-state and is in an off-state when said switching element for switching the capacitance value is in an on-state.

3. The PLL circuit according to claim 2, wherein said voltage follower comprises an operational amplifier whose output terminal is connected to an inverting input terminal.

4. The PLL circuit according to claim 1, wherein:

said charge circuit comprises a voltage follower, to which the potential of said first capacitive element being inputted and the output terminal of which being connected to said one end of said second capacitive element, and said voltage follower has a function to be in a high impedance output state, the voltage follower being in a normal output state when said switching element for switching the capacitance value is in an off-state and in a high impedance output state when said switching element for switching the capacitance value is in an on-state.

5. The PLL circuit according to claim 4, wherein said voltage follower comprises an operational amplifier whose output terminal is connected to an inverting input terminal.

6. The PLL circuit according to claim 1, wherein:

said charge circuit comprises: an amplifier circuit for amplifying a potential difference appearing across said resistance using a potential of said one end of said first capacitive element as a reference; and a charge control switching element connected between an output terminal of said amplifier circuit and said one end of said second capacitive element, said charge control switching element is in an on-state when said switching element for switching the capacitance value is in an off-state and is in an off-state when said switching element for switching the capacitance value is in an on-state.

7. The PLL circuit according to claim 6, wherein said amplifier circuit comprises: a first operational amplifier, the output terminal of which being connected to an inverting input terminal, and the noninverting input terminal of which being connected to said one end of said first capacitive element; a first resistance element, one end of which being connected to the output terminal of said first operational amplifier; a second operational amplifier, the inverting input terminal of which being connected to the other end of said first resistance element, the noninverting input terminal of which being connected to a terminal opposite to said one end of said first capacitive element in said resistance, and the output terminal of which being connected to said charge control switching element; and a second resistance element connected between the output terminal and the inverting input terminal of said second operational amplifier.

8. The PLL circuit according to claim 1, wherein:

said charge circuit comprises an amplifier circuit for amplifying a potential difference appearing across said resistance using a potential of said one end of said first capacitive element as a reference, the output terminal of said amplifier circuit being connected to said one end of said second capacitive element, and said amplifier circuit has a function to be in a high impedance output state, the amplifier circuit being in a normal output state when said switching element for switching the capacitance value is in an off-state and in a high impedance output state when said switching element for switching the capacitance value is in an on-state.

9. The PLL circuit according to claim 8, wherein:

said amplifier circuit comprises: a first operational amplifier, the output terminal of which being connected to an inverting input terminal, and the noninverting input terminal of which being connected to said one end of said first capacitive element;

a first resistance element, one end of which being connected to the output terminal of said first operational amplifier;

a second operational amplifier, the inverting input terminal of which being connected to the other end of said first resistance element, the noninverting input terminal of which being connected to a terminal opposite to said one end of said first capacitive element in said resistance, and the output terminal of which being connected to said charge control switching element; and a second resistance element connected between the output terminal and the inverting input terminal of said second operational amplifier.

10. The PLL circuit according to claim 1, wherein:

said resistance comprises a series circuit of a first resistance element and a second resistance element, said resistance switching section comprises a switching element for switching a resistance value, which is connected in parallel to either said first resistance element or said second resistance element, and said switching element for switching the resistance value is in an off-state when said switching element for switching the capacitance value is in an off-state and is in an on-state when said switching element for switching the capacitance value is in an on-state.

11. A PLL characteristic switching method of switching a response characteristic of a PLL circuit which operates at a predetermined natural angular frequency and a predetermined damping factor, wherein said PLL circuit includes at least a voltage controlled oscillator; a phase comparator for comparing phases between an output signal of said voltage controlled oscillator and a reference signal; and a loop filter including a capacitance circuit and a resistance circuit connected to said capacitance circuit in series to provide a low-pass component of an output signal of said phase comparator to said voltage controlled oscillator as a control voltage, wherein said capacitance circuit includes first and second capacitive elements connected in parallel, a switch for switching the capacitance value, one end of which being directly connected to one end of said first capacitive element and another end of which being directly connected to one end of said second capacitive element, and a charge circuit for charging said first and second capacitive elements at the same potential when said switch for switching the capacitance value is in an off-state, wherein said resistance circuit includes two resistive elements connected in series, and a switch for switching a resistance value provided in parallel in either of said two resistive elements, the PLL characteristic switching method comprising:

a step (a) of turning both of said switch for switching the capacitance value and said switch for switching the resistance value into an on-state; and a step (b) of turning both of said switch for switching the capacitance value and said switch for switching the resistance value into an off-state in order to increase said natural angular frequency while maintaining said damping factor at a constant value.

12. A PLL characteristic switching method of switching a response characteristic of a PLL circuit which operates at a predetermined natural angular frequency and a predetermined damping factor, wherein said PLL circuit includes at least a voltage controlled oscillator; a phase comparator for comparing phases between an output signal of said voltage controlled oscillator and a reference signal; and a loop filter including a capacitance circuit and a resistance circuit connected to said capacitance circuit in series to provide a low-pass component of an output signal of said phase comparator to said voltage controlled oscillator as a control voltage, wherein said capacitance circuit includes first and second capacitive elements connected in parallel, a switch for switching the capacitance value, one end of which being connected to one end of said first capacitive element and another end of which being connected to one end of said second capacitive element, and a charge circuit for charging said first and second capacitive elements at the same potential when said switch for switching the capacitance value is in an off-state, wherein said resistance circuit includes two resistive elements connected in series, and a switch for switching a resistance value provided in parallel in either of said two resistive elements, wherein said charge circuit comprises a voltage follower, to which a potential of said first capacitive element being inputted, and a charge control switching element connected between an output terminal of said voltage follower and said one end of said second capacitive element, the PLL characteristic switching method comprising:

a step (a) of turning into an on-state each of: (1) said switch for switching the capacitance value, (2) said switch for switching the resistance value, and said charge control switching element; and a step (b) of turning said charge control switching element into an on-state and turning both of said switch for switching the capacitance value and said switch for switching the resistance value into an off-state in order to switch said natural angular frequency while maintaining said damping factor at a constant value.

* * * * *